US012593484B2

(12) United States Patent (10) Patent No.: US 12,593,484 B2
Liu et al. (45) Date of Patent: Mar. 31, 2026

(54) SILICON CARBIDE SINGLE CRYSTAL WAFER, CRYSTAL, PREPARATION METHODS THEREFOR, AND SEMICONDUCTOR DEVICE

(71) Applicants: TANKEBLUE SEMICONDUCTOR CO., LTD., Beijing (CN); XINJIANG TANKEBLUE SEMICONDUCTOR CO. LTD, Shihezi (CN); JIANGSU TANKEBLUE SEMICONDUCTOR CO., LTD, Xuzhou (CN)

(72) Inventors: Chunjun Liu, Beijing (CN); Yanfang Lou, Beijing (CN); Tonghua Peng, Beijing (CN); Bo Wang, Beijing (CN); Ning Zhao, Beijing (CN); Yu Guo, Beijing (CN); Jian Yang, Beijing (CN); Ping Zhang, Xuzhou (CN); Yu Zou, Xuzhou (CN); Fan Yang, Shihezi (CN)

(73) Assignees: TANKEBLUE SEMICONDUCTOR CO., LTD, Beijing (CN); XINJIANG TANKEBLUE SEMICONDUCTOR CO. LTD., Xinjiang (CN); JIANGSU TANKEBLUE SEMICONDUCTOR CO., LTD, Jiangsu (CN)

( * ) Notice: Subject to any disclaimer, the term of this patent is extended or adjusted under 35 U.S.C. 154(b) by 817 days.

(21) Appl. No.: 17/796,863

(22) PCT Filed: Dec. 3, 2020

(86) PCT No.: PCT/CN2020/133523
§ 371 (c)(1),
(2) Date: Aug. 1, 2022

(87) PCT Pub. No.: WO2022/110265
PCT Pub. Date: Jun. 2, 2022

(65) Prior Publication Data
US 2023/0053509 A1 Feb. 23, 2023

(30) Foreign Application Priority Data

Nov. 25, 2020 (CN) .......................... 202011341347.4

(51) Int. Cl.
H10D 62/832 (2025.01)
C01B 32/956 (2017.01)
(Continued)

(52) U.S. Cl.
CPC ....... H10D 62/8325 (2025.01); C01B 32/956 (2017.08); C30B 23/02 (2013.01);
(Continued)

(58) Field of Classification Search
CPC .. H10D 62/8325; C01B 32/956; C30B 23/02; C30B 29/36; C30B 33/02; C01P 2006/10
See application file for complete search history.

(56) References Cited

U.S. PATENT DOCUMENTS 6,780,243 B1 8/2004 Wang et al.
6,863,728 B2 3/2005 Vodakov et al.
(Continued)

FOREIGN PATENT DOCUMENTS

CN 103590101 A 2/2014
CN 105658846 A 6/2016
(Continued)

OTHER PUBLICATIONS

W. Chen and M. A. Capano. Journal or Applied Physics, 98, 114907 (Year: 2005).*
(Continued)

*Primary Examiner* — Paul A Wartalowicz
*Assistant Examiner* — Nicholas A. Piro
(74) *Attorney, Agent, or Firm* — Husch Blackwell LLP

(57) ABSTRACT
A silicon carbide single crystal wafer and a preparation method therefor, a silicon carbide crystal and a preparation
(Continued)

method therefor, and a semiconductor device. The surface of the silicon carbide single crystal wafer is such that an included angle between a normal direction and a c direction is 0-8 degrees, and aggregated dislocations on the silicon carbide single crystal wafer are less than $300/cm^2$; the aggregated dislocation is a dislocation aggregated condition in which the distance between the geometric centers of any two corrosion pits in the corrosion pits obtained after corrosion of melted KOH is less than 80 microns. Even if the dislocation density is relatively high, the aggregated dislocation density is relatively small, thereby increasing the yield of a silicon carbide-based devices.

15 Claims, 8 Drawing Sheets

(51) Int. Cl.
*C30B 23/02* (2006.01)
*C30B 29/36* (2006.01)
*C30B 33/02* (2006.01)
(52) U.S. Cl.
CPC .............. *C30B 29/36* (2013.01); *C30B 33/02* (2013.01); *C01P 2006/10* (2013.01)

(56) References Cited

U.S. PATENT DOCUMENTS

| | | | |
|---|---|---|---|
| 7,449,065 B1 | 11/2008 | Powell et al. | |
| 2012/0060751 A1* | 3/2012 | Urakami | C30B 23/00 117/106 |
| 2016/0108553 A1 | 4/2016 | Harada et al. | |
| 2016/0215414 A1 | 7/2016 | Kabayashi et al. | |
| 2019/0194818 A1* | 6/2019 | Igi | C30B 23/063 |
| 2021/0108334 A1* | 4/2021 | Kamata | C30B 29/36 |

FOREIGN PATENT DOCUMENTS

| | | |
|---|---|---|
| CN | 108588817 A | 9/2018 |
| CN | 109957841 A | 7/2019 |
| CN | 111172592 A | 5/2020 |
| CN | 111705363 A | 9/2020 |
| JP | 2012176867 A | 9/2012 |
| JP | 2017095304 A | 6/2017 |
| JP | 2020152632 A | 9/2020 |

OTHER PUBLICATIONS

International Search Report with English translation for PCT/CN2020/133523 mailed Aug. 24, 2021, 11 pages.
Japanese Office Action corresponding to 2022-544075 dated Aug. 9, 2023.
English Summary of Japanese Office Action corresponding to 2022-544075 dated Aug. 9, 2023.
International Search Report for PCT/CN2021/091348 mailed Jan. 29, 2022, 3 pages.
English translation of International Search Report for PCT/CN2021/091348 mailed Jan. 29, 2022, 2 pages.
International Written Opinion for PCT/CN2021/091348 mailed Aug. 24, 2021, 3 pages.
English translation of International Written Opinion for PCT/CN2021/091348 mailed Jan. 29, 2022, 3 pages.
International Written Opinion for PCT/CN2020/133523 mailed Aug. 24, 2021, 3 pages.
English translation of International Written Opinion for PCT/CN2020/133523 mailed Aug. 24, 2021, 3 pages.

* cited by examiner

30

40

50

C

A

C

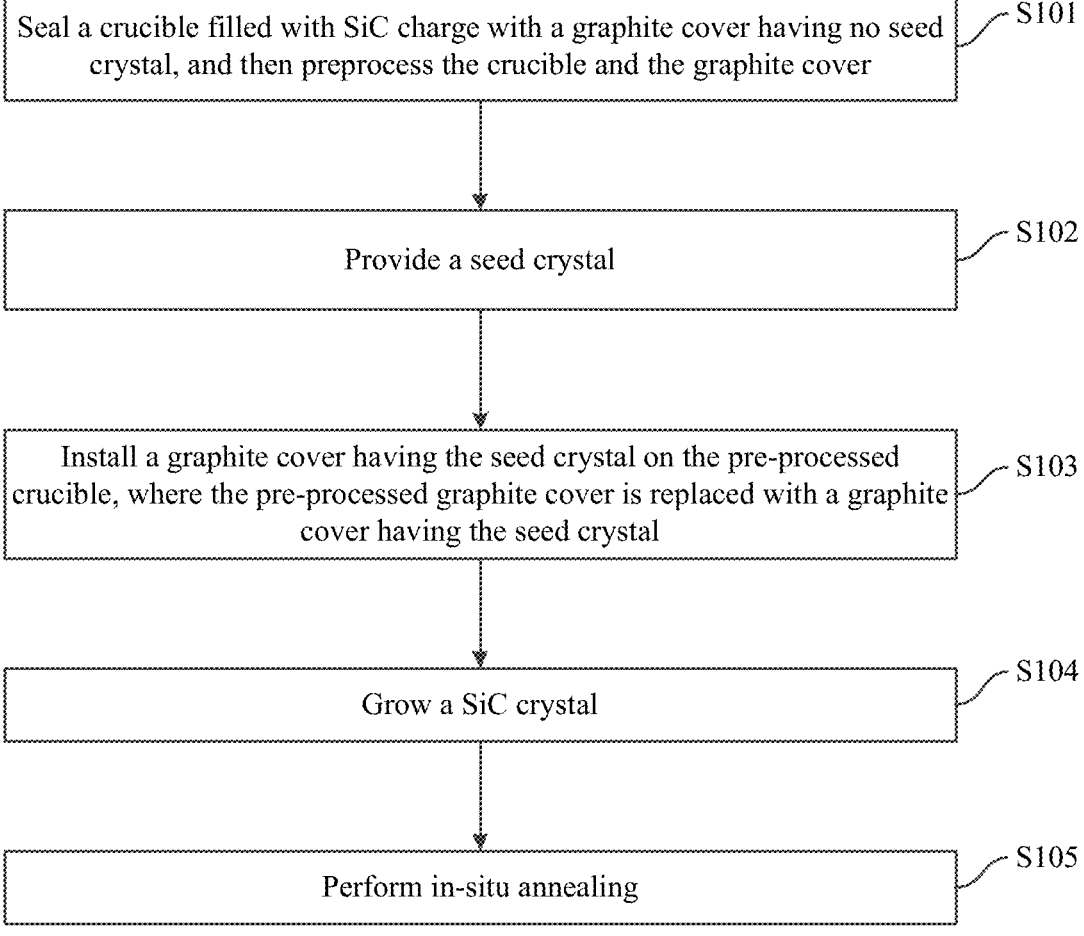

Seal a crucible filled with SiC charge with a graphite cover having no seed crystal, and then preprocess the crucible and the graphite cover — S101

Provide a seed crystal — S102

Install a graphite cover having the seed crystal on the pre-processed crucible, where the pre-processed graphite cover is replaced with a graphite cover having the seed crystal — S103

Grow a SiC crystal — S104

Perform in-situ annealing — S105

Figure 12

SILICON CARBIDE SINGLE CRYSTAL WAFER, CRYSTAL, PREPARATION METHODS THEREFOR, AND SEMICONDUCTOR DEVICE

This application is the national phase of International Application No. PCT/CN2020/133523, titled "SILICON CARBIDE SINGLE CRYSTAL WAFER, CRYSTAL, PREPARATION METHODS THEREFOR, AND SEMI-CONDUCTOR DEVICE", filed on Dec. 3, 2020, which claims priority to Chinese Patent Application NO. 202011341347.4, titled "SILICON CARBIDE MONOC-RYSTALLINE WAFER AND CRYSTAL, METHOD FOR MANUFACTURING THE SAME, AND SEMICONDUC-TOR DEVICE", filed on Nov. 25, 2020 with the China National Intellectual Property Administration, which is incorporated herein by reference in its entirety.

FIELD

The present disclosure relates to the technical field of semiconductor materials, and in particular to a silicon carbide monocrystalline wafer, a method for manufacturing the silicon carbide monocrystalline wafer, a silicon carbide crystal, a method for manufacturing the silicon carbide crystal, and a semiconductor device.

BACKGROUND

In conventional technology, dislocations are one of the major defects in silicon carbide monocrystalline wafer, which has a significant impact on performances of silicon carbide devices. Even though the density of dislocations keeps decreasing with the technique evolves, it is still high in current commercially available products and not satisfactory for multiple purposes.

It is found that a yield of devices cannot always be increased even when the density of dislocations on wafers is reduced. There is a lot to be discovered regarding to the correlation between dislocations and device failures.

SUMMARY

In view of the above, a silicon carbide monocrystalline wafer and a method for manufacturing the same, a silicon carbide crystal and a method for manufacturing the same, and a semiconductor device are provided according to embodiments of the present disclosure. Thereby, addressed is an issue that a yield of devices is not increased even when a density of dislocations is reduced in conventional technology.

In order to achieve the above objective, following technical solutions are provided according to embodiments of the present disclosure.

A silicon carbide monocrystalline wafer is provided, where: an included angle between a normal direction of a surface of the silicon carbide monocrystalline wafer and a direction of a c-axis ranges from 0° to 8°, end points included; a density of clustered dislocations in the silicon carbide monocrystalline wafer is lower than 300/cm$^2$; and the clustered dislocations constitute a dislocation cluster in which a distance between geometric centers of every two of etching pits is less than 80 μm when the silicon carbide monocrystalline wafer is etched by using molten potassium hydroxide, where the etching pits are exposed on the surface of the silicon carbide monocrystalline wafer.

Preferably, the clustered dislocations are clustered threading screw dislocations, where: the included angle between the normal direction of the surface of the silicon carbide monocrystalline wafer and the direction of the c-axis ranges from 0° to 8°, end points included; a density of the clustered threading screw dislocations on the silicon carbide monocrystalline wafer is less than 20/cm$^2$; and the clustered threading screw dislocations constitute a dislocation cluster in which a distance between geometric centers of every two of etching pits corresponding to threading screw dislocations is less than 80 μm when the silicon carbide monocrystalline wafer is etched by using molten potassium hydroxide, and the etching pits corresponding to the threading screw dis-locations are exposed on the surface of the silicon carbide monocrystalline wafer.

Preferably, the clustered dislocations are clustered thread-ing screw dislocations, where: the included angle between the normal direction of the surface of the silicon carbide monocrystalline wafer and the direction of the c-axis ranges from 0° to 8°, end points included; a density of the clustered threading screw dislocations on the silicon carbide monoc-rystalline wafer is less than 5/cm$^2$; and the clustered thread-ing screw dislocations constitute a dislocation cluster in which a distance between geometric centers of every two of etching pits corresponding to threading screw dislocations is less than 60 μm when the silicon carbide monocrystalline wafer is etched by using molten potassium hydroxide, and the etching pits corresponding to the threading screw dis-locations are exposed on the surface of the silicon carbide monocrystalline wafer.

Preferably, the clustered dislocations are clustered basal plane dislocations, where: the included angle between the normal direction of the surface of the silicon carbide monoc-rystalline wafer and the direction of the c-axis ranges from 2° to 8°, end points included; a density of the clustered basal plane dislocations on the silicon carbide monocrystalline wafer is less than 50/cm$^2$; and the clustered basal plane dislocations constitute a dislocation cluster in which a distance between geometric centers of every two of etching pits corresponding to basal plane dislocations is less than 40 μm when the silicon carbide monocrystalline wafer is etched by using molten potassium hydroxide, and the etching pits corresponding to the basal plane dislocations are exposed on the surface of the silicon carbide monocrystalline wafer.

Preferably, the clustered dislocations are clustered thread-ing edge dislocations, where: the included angle between the normal direction of the surface of the silicon carbide monoc-rystalline wafer and the direction of the c-axis ranges from 0° to 8°, end points included; a density of the clustered threading edge dislocations on the silicon carbide monoc-rystalline wafer is less than 200/cm$^2$; and the clustered threading edge dislocations constitute a dislocation cluster in which a distance between geometric centers of every two of etching pits is less than 60 μm when the silicon carbide monocrystalline wafer is etched by using molten potassium hydroxide, and the etching pits are exposed on the surface of the silicon carbide monocrystalline wafer.

Preferably, the clustered dislocations are clustered hybrid dislocation, where: the included angle between the normal direction of the surface of the silicon carbide monocrystal-line wafer and the direction of the c-axis ranges from 2° to 8°, end points included; a density of the clustered hybrid dislocations on the silicon carbide monocrystalline wafer is less than 50/cm$^2$; and the clustered hybrid dislocations constitute a dislocation cluster in which a distance between geometric centers of every two of etching pits that corre-spond to dislocations of different types is less than 60 μm when the silicon carbide monocrystalline wafer is etched by using molten potassium hydroxide, and the etching pits are exposed on the surface of the silicon carbide monocrystalline wafer.

A method for manufacturing a silicon carbide crystal is further provided according to an embodiment of the present disclosure, including: sealing a crucible with a graphite cover having no seed crystal, where the crucible is filled with silicon carbide charge; preprocessing the crucible sealed with the graphite cover; providing a seed crystal, where a density of clustered dislocations in the seed crystal is less than 200/cm$^2$; installing a graphite cover having the seed crystal on the pre-processed crucible, where the pre-processed graphite cover is replaced with the graphite cover having the seed crystal; growing the silicon carbide crystal; and performing in-situ annealing.

Preferably, a density of clustered threading screw dislocations in the seed crystal is less than 10/cm$^2$.

Preferably, the preprocessing includes: setting a temperature in the crucible in a range from 2000° C. to 2200° C., with a pressure in the crucible less than 10 Pa, and exhausting the crucible continuously with a vacuum pump, where the pre-processing lasts for 1 hour to 10 hours.

Preferably, growing the silicon carbide crystal includes: growing the silicon carbide crystal by using the graphite cover having the seed crystal in which the density of the clustered dislocations is less than 200/cm$^2$, under a growth temperature ranging from 2200° C. and 2300° C. and a growth pressure ranging from 50 Pa to 4000 Pa, wherein fluctuations of the growth temperature is less than 2° C. and fluctuations of the growth pressure is less than 0.2 Pa.

Additionally, growing the silicon carbide crystal includes: growing the silicon carbide crystal by using the graphite cover having the seed crystal in which the density of the clustered dislocations is less than 200/cm$^2$, under a growth temperature ranging from 2200° C. and 2300° C. and a growth pressure ranging from 50 Pa to 4000 Pa, wherein fluctuations of the growth temperature is less than 1° C. and fluctuations of the growth pressure is less than 0.1 Pa.

Additionally, growing the silicon carbide crystal includes: growing the silicon carbide crystal by using the graphite cover having the seed crystal in which the density of the clustered dislocations is less than 200/cm$^2$, under a growth temperature ranging from 2200° C. and 2300° C. and a growth pressure ranging from 50 Pa to 4000 Pa, wherein fluctuations of the growth temperature is less than 0.5° C. and fluctuations of the growth pressure is less than 0.05 Pa.

Preferably, the in-situ annealing includes: annealing, for a period ranging from 10 hours to 100 hours, at a temperature which is higher than the growth temperature by a difference ranging from 50° C. to 200° C. and at a pressure which is higher than 20000 Pa.

A silicon carbide crystal is further provided according to an embodiment of the present disclosure. The silicon carbide crystal is manufactured through any forgoing method.

A method for manufacturing a silicon carbide monocrystalline wafer is further provided according to an embodiment of the present disclosure, including: providing the foregoing silicon carbide crystal; and cutting, grinding, and polishing the provided silicon carbide crystal to obtain the silicon carbide monocrystalline wafer.

A semiconductor device is further provided according to an embodiment of the present disclosure, which is manufactured from any foregoing silicon carbide monocrystalline wafer.

In the foregoing technical solutions, the silicon carbide monocrystalline wafer is provided according to embodiments of the present disclosure. The included angle between the normal direction of the surface of the silicon carbide monocrystalline wafer and the direction of the c-axis ranges from 0° to 8°, and the density of the clustered dislocations in the silicon carbide monocrystalline wafer is lower than 300/cm$^2$. The clustered dislocations refer to the dislocation cluster in which the distance between geometric centers of every two etching pits is less than 80 μm when the silicon carbide monocrystalline wafer is etched by using molten potassium hydroxide. Additionally, the clustered dislocations may refer to the dislocation cluster in which the distance between geometric centers of every two etching pits is less than 50 μm when the silicon carbide monocrystalline wafer is etched by using molten potassium hydroxide. When the density of the clustered dislocations is low, a density of dislocations may not be low, but the yield of SiC-based devices may still be effectively improved. Specifically, the included angle between the normal direction of the surface of the silicon carbide monocrystalline wafer and the direction of the c-axis ranges from 0° to 8°, and the density of the clustered dislocations in the silicon carbide monocrystalline wafer is less than a specific value. In comparison, the density of the dislocations of the wafer may be not low, for example, higher than 1000/cm$^2$, 2000/cm$^2$, or even higher than 4000/cm$^2$. Still, the density of the dislocations should not be too high, otherwise additional dislocation clusters may be formed, to some extent. In embodiment of the present disclosure, the density of the dislocations in the wafer is less than 10000/cm$^2$.

The method for manufacturing the silicon carbide monocrystalline wafer is further provided according to embodiments of the present disclosure. The silicon carbide monocrystalline wafer having a low density of clustered dislocations is manufactured under restricted processing conditions, and it is not necessary to provide a harsh processing requirement for lowering the density of the dislocations. In comparison of conventional technology, the method for manufacturing the silicon carbide monocrystalline wafer is simplified, and the production of silicon carbide monocrystalline wafers and semiconductors is less difficult.

BRIEF DESCRIPTION OF THE DRAWINGS

For clearer illustration of the technical solutions according to embodiments of the present disclosure or conventional techniques, hereinafter briefly described are the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

FIG. 12 is a flowchart of a method for manufacturing a silicon carbide crystal according to an embodiment of the present disclosure.

DETAILED DESCRIPTION

Figure 1:
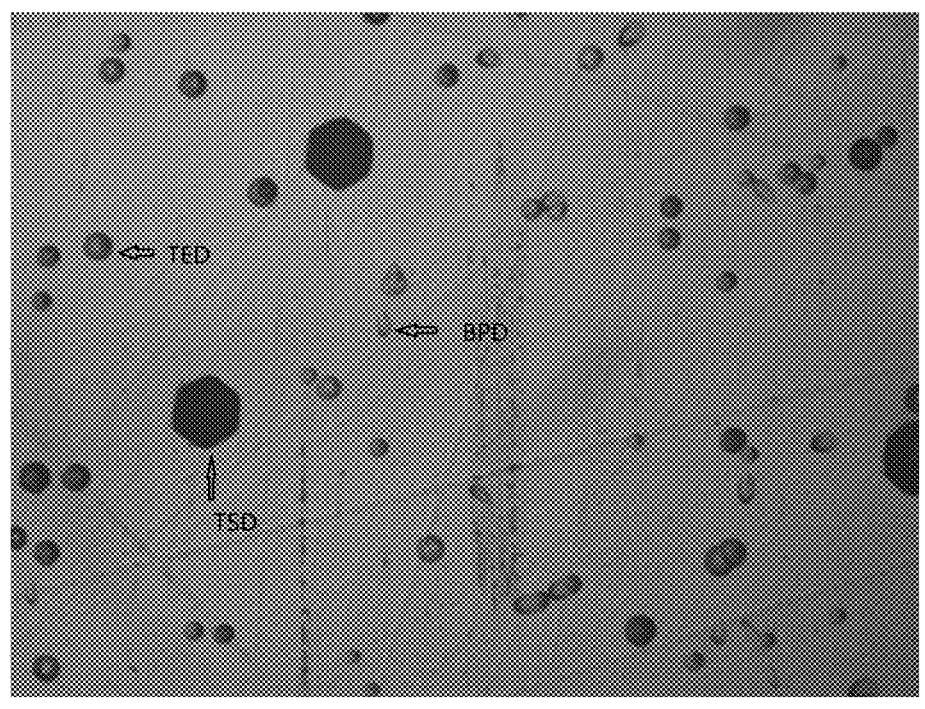
FIG. 1 is an optical microscopy image of a silicon carbide monocrystalline wafer etched by using molten potassium hydroxide, which has dislocations of multiple types according to an embodiment of the present disclosure.

As describe in the background, a yield of devices is not increased even when a density of dislocations on a wafer is reduced a lot.

Massive researches on dislocations in silicon carbide (SiC) reveals that dislocation clustering is a key factor affecting quality of a silicon carbide crystal. Merely lowering the density of dislocations is rather difficult and cannot improve the quality of silicon carbide, especially cannot improve the yield of SiC-based devices.

In view of the above, a SiC monocrystalline wafer is provided according to embodiments of the present disclosure. An included angle between a normal direction of a surface of the SiC monocrystalline wafer and a direction of the c-axis of the SiC monocrystalline wafer ranges from 0° to 8°, end points included.

A density of clustered dislocations in the silicon carbide monocrystalline wafer is lower than $300/cm^2$, preferably less than $150/cm^2$, more preferably less than $75/cm^2$, further more preferably less than $35/cm^2$, further more preferably less than $10/cm^2$, further more preferably less than $5/cm^2$, further more preferably less than $1/cm^2$, further more preferably less than $0.5/cm^2$, or further more preferably less than $0.1/cm^2$.

The clustered dislocations constitute a dislocation cluster in which a distance between geometric centers of every two (i.e., any two) of etching pits is less than 80 μm when the silicon carbide monocrystalline wafer is etched by using molten potassium hydroxide, and the etching pits are exposed on the surface of the silicon carbide monocrystalline wafer. Additionally, the clustered dislocations may constitute a dislocation cluster in which a distance between geometric centers of every two of etching pits is less than 60 μm when the silicon carbide monocrystalline wafer is etched by using molten potassium hydroxide.

The low-dislocation-cluster SiC monocrystalline wafer according to embodiments of the present disclosure addresses the key factor limiting the quality of SiC crystal, improves the yield of SiC monocrystalline wafers, and at the same time improves the yield of SiC-based devices.

Hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

According to embodiments of the present disclosure, the included angel between the normal direction of the surface of the SiC monocrystalline wafer and the direction of the c-axis ranges from 0° to 8°, end points included. The direction of the c-axis (also called the c-direction) refers to a direction perpendicular to the (0008) plane of a seed crystal. In these embodiments, the included angel between the normal direction of the surface of the SiC monocrystalline wafer and the direction of the c-axis ranges from 0° to 8°. Generally, the above included angle is approximately 4° or approximately 0°.

In these embodiments, the density of the clustered dislocations in the SiC monocrystalline wafer is less than $300/cm^2$. Herein the clustered dislocations are defined as the dislocation cluster in which the distance between the geometric centers of every two etching pits is less than 80 μm when the SiC monocrystalline wafer is etched by using molten potassium hydroxide, where the etching pits are exposed on the surface of the SiC monocrystalline wafer. That is to say, in a case a distance between geometric centers of two etching pits is less than 80 μm, the dislocations corresponding to the two etching pits are clustered dislocations. The density of the clustered dislocations is low in the SiC monocrystalline wafer according to embodiments of the present disclosure.

The clustered dislocation reflects a degree of clustering among the dislocations, and the density of the clustered dislocations refers to a quantity of clustered dislocations per unit area. The density of clustered dislocations and the density of dislocations are two different concepts. It is possible that in one unit area, the density of dislocations is high while the density of clustered dislocations is low. For example, in one unit area, the dislocations are dense and uniformly distributed such that there are almost no clustered dislocations complying with the above definition. In such case, the density of clustered dislocations is low. In a similar manner, it is also possible that in one unit area the density of dislocations is low while the density of clustered dislocations is high. For example, in one unit area, the dislocations are sparse but aggregate as several groups, and thereby comply with the above definition of clustered dislocations. Consequently, a density of clustered dislocations is higher than the forgoing case of almost no clustered dislocations.

In order to facilitate illustration of these embodiments, 2 dislocations that aggregate and comply with the above definition may be defined as 1 dense dislocation region. In a case that there are 3 aggregating dislocations, there are 1.5 dense dislocation regions. Specifically, a quantity of dense dislocation regions is half of a quantity of the dislocations that comply with the above definition of clustered dislocations. The density of clustered dislocations is defined as a total quantity of the clustered dislocations across the whole wafer divided by an area of the wafer. Thereby, the density of clustered dislocations can be obtained.

Herein a type of the dislocations is not limited, and a type of the dislocations in a single SiC monocrystalline wafer is not limited either. Generally, multiple types of dislocations are inevitable in a SiC monocrystalline wafer, for example, threading screw dislocations (TSD), threading edge dislocations (TED), and basal plane dislocations (BPD). Reference is made to FIG. 1. The SiC monocrystalline wafer has multiple threading screw dislocations (TSD), multiple threading edge dislocations (TED), and multiple basal plane dislocations (BPD), and these types of dislocations have different densities.

Herein an individual density of each type of dislocations is not limited, as long as they are low enough to satisfy a substantial requirement on a semiconductor device. On such basis, the density of clustered dislocations in the SiC monocrystalline wafer according to embodiments of the present disclosure is less than $300/cm^2$, preferably less than $150/cm^2$, more preferably less than $70/cm^2$, more preferably less than $35/cm^2$, or more preferably less than $10/cm^2$. Specifically, following embodiments illustrate the density corresponding to each type of dislocations in conjunction with the drawings.

Figure 2:
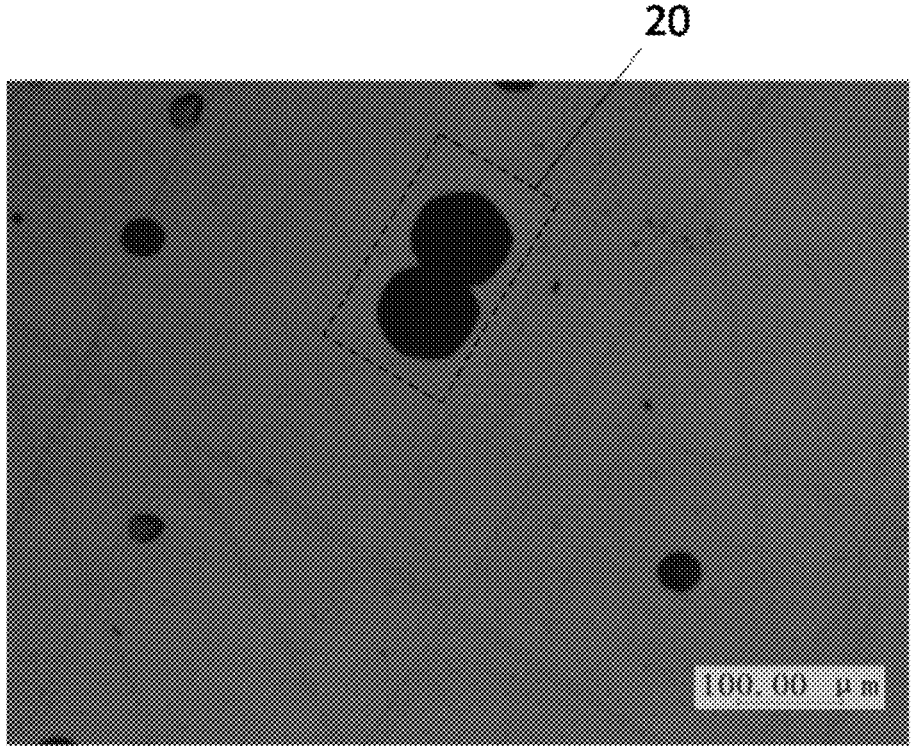
FIGS. 2 to 11 are optical microscope images of silicon carbide monocrystalline wafers etched by using molten potassium hydroxide, each of which has clustered dislocations according to embodiments of the present disclosure.

In one embodiment, the clustered dislocations may be clustered threading screw dislocations. Reference is made to FIG. 2. The clustered threading screw dislocation 20 constitute a dislocation cluster in which a distance between geometric centers of every two of etching pits corresponding to threading screw dislocations is less than 80 μm when SiC monocrystalline wafer is etched by using molten potassium hydroxide, and the etching pits corresponding to the threading screw dislocations are exposed on the surface of the SiC monocrystalline wafer.

When the seed crystal is growing, the dislocations would be inherited from the seed crystal. In most cases, the threading screw dislocations and the threading edge dislocations extend along the direction of the c-axis, and an intersection of the dislocation line and the wafer surface would be enlarged and turn into an etching pit when subject to etching. Substantially, these dislocations do not move when the seed crystal grows along a direction having little deviation (that is, between the normal direction of the surface of the SiC monocrystalline wafer and the direction of the c-axis), and the etching pit is more obvious for the 0° case. The basal plane dislocations move within the c-plane, and the dislocation line thereof does not intersect with the wafer surface corresponding to 0°. Hence, their etching pits can only be formed on an etched surface that has certain deviation. Therefore, during the growth, the dislocation cluster comprising pure threading screw dislocations, pure threading edge dislocations, or a combination of the two would generally be inherited, while the dislocation cluster comprising basal plane dislocations generally would generally not be inherited. In following embodiments, the threading screw dislocations and the threading edge dislocations are revealed by etching a surface having an included angle ranging from 0° to 8° (end points included) with respect to the direction of the c-axis. In order to facilitating counting, the basal plane dislocations are revealed by etching on a surface having an included angle ranging from 1° to 8° (end points included) with respect to the direction of the c-axis.

The included angle between the normal direction of the surface of the SiC monocrystalline wafer and the direction of the c-axis ranges from 0° to 8°, end points included. A density of clustered threading screw dislocations in the SiC monocrystalline wafer is less than 20/cm². In other embodiments, the clustered threading screw dislocations refer to a dislocation cluster in which a distance between geometric centers of every two etching pits is less than 60 μm, which corresponds to improved performances of the SiC monocrystalline wafer. More preferably, the clustered threading screw dislocations may refer to a dislocation cluster in which a distance between geometric centers of every two etching pits is less than 40 μm. The density of the clustered threading screw dislocations may be further limited to less than 10/cm². In other embodiments, such density may be preferably less than 5/cm², more preferably less than 2/cm², more preferably less than 1/cm², more preferably less than 0.5/cm², or more preferably less than 0.1/cm². The lower the density of clustered threading screw dislocations is, the less level the dislocations aggregate. Hence, the production yield of SiC-based devices can be further improved even under dense dislocations.

Figure 3:
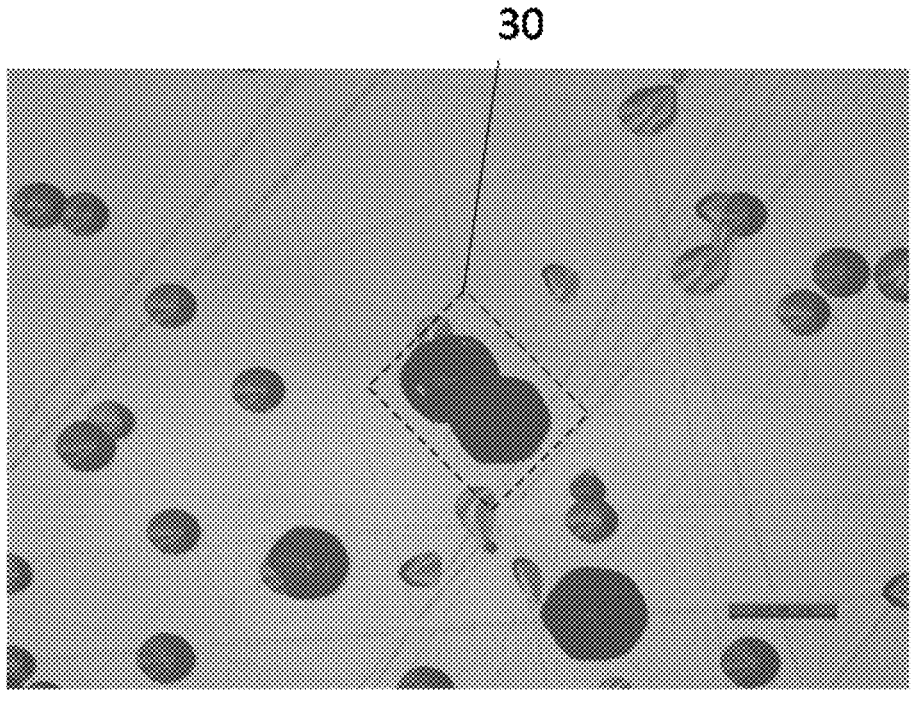

In another embodiment, the clustered dislocations may be clustered threading screw dislocations. Specifically, as shown in FIG. 3, the clustered threading screw dislocations 30 constitute a dislocation cluster in which a distance between geometric centers of every two etching pits is less than 60 μm when the SiC monocrystalline wafer is etched by using molten potassium hydroxide, and the etching pits are exposed on the surface of the SiC monocrystalline wafer. The surface of the SiC monocrystalline wafer has a deviation angle ranging from 0° to 8° with respect to the direction of the c-axis, end points included. A density of the clustered threading screw dislocations in the SiC monocrystalline wafer is less than 10/cm².

Figure 4:
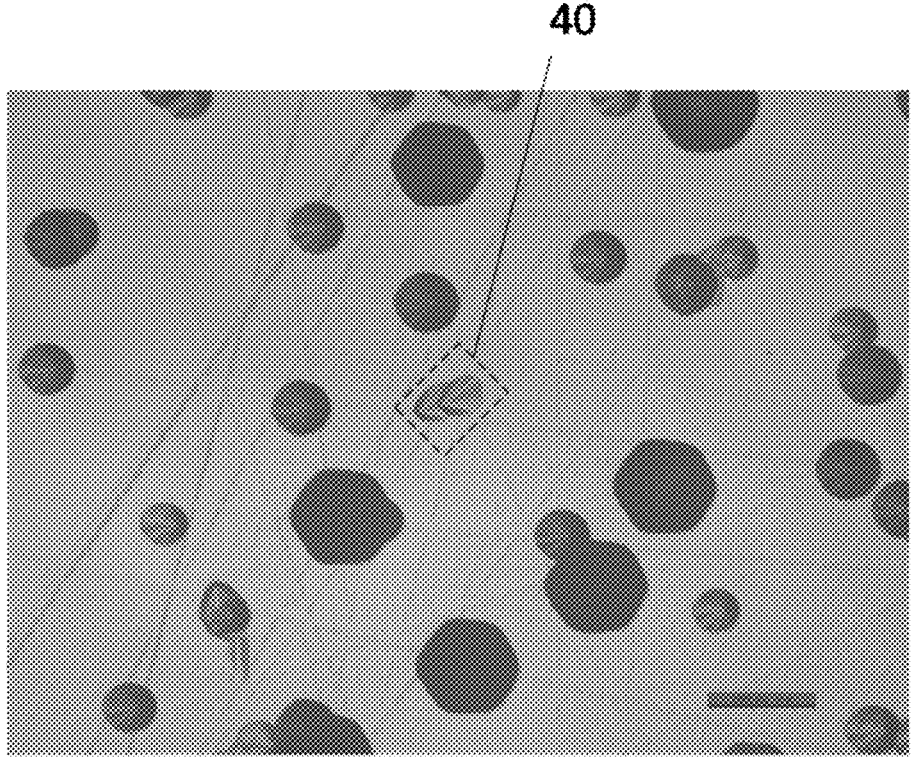

In another embodiment, the clustered dislocations may be clustered basal plane dislocations. Specifically, as shown in FIG. 4, the clustered basal plane dislocations 40 constitute a dislocation cluster in which a distance between geometric centers of every two etching pits is less than 40 μm when the SiC monocrystalline wafer is etched by using molten potassium hydroxide, and the etching pits are exposed on the surface of the SiC monocrystalline wafer. As can be seen from FIG. 4, the basal plane dislocations correspond to a smaller diameter or a smaller dimension than the threading screw dislocations. Hence, in this embodiment, the clustered basal plane dislocations refer to the dislocation cluster in which the distance between geometric centers of every two of the etching pits is less than 40 μm.

The surface of the SiC monocrystalline wafer has a deviation angle ranging from 2° to 8° with respect to the direction of the c-axis, end points included. A density of clustered basal plane dislocations in the SiC monocrystalline wafer is less than 50/cm². The basal plane dislocations are more than the threading screw dislocations, and hence the density of clustered basal plane dislocations is limited to less than 50/cm² herein. Although such threshold is slightly higher than that of the clustered threading screw dislocations, lots of experiments have verified that the yield of SiC can still be improved.

In other embodiments, the clustered basal plane dislocation may refer to a dislocation cluster in which a distance between geometric centers of any two etching pits is less than 30 μm, which corresponds to improved performances of the SiC monocrystalline wafer. More preferably, the clustered basal plane dislocations may refer to a dislocation cluster in which a distance between geometric centers of any two etching pits is less than 20 μm. The density of clustered basal plane dislocations may be limited to less than 20/cm². In other embodiments, such density may be more preferably less than 10/cm², more preferably less than 5/cm², more preferably less than 2/cm², more preferably less than 1/cm², or more preferably less than 0.5/cm². The lower the density of clustered basal plane dislocations is, the lower degree the dislocations aggregate at. Hence, the production yield of SiC-based wafers can be further improved even under dense dislocations.

Figure 5:
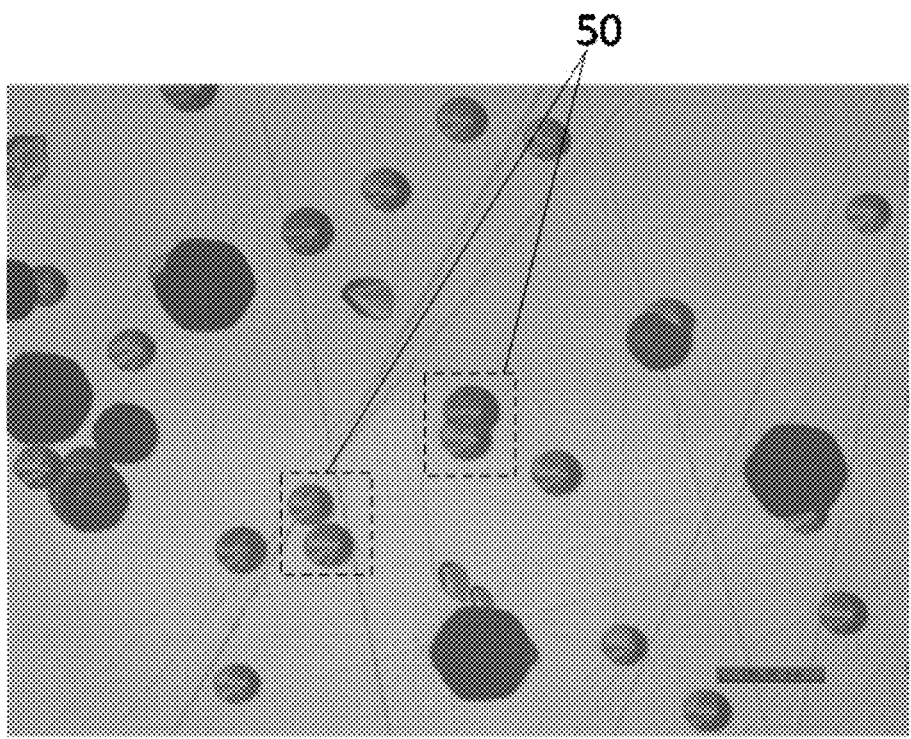
Figure 6:
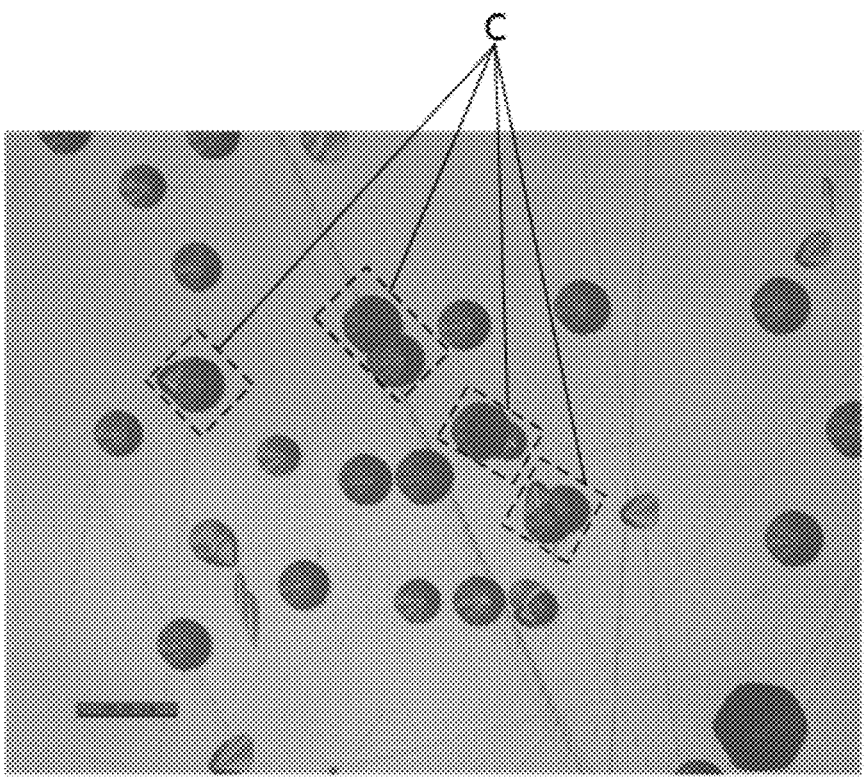
Figure 7:
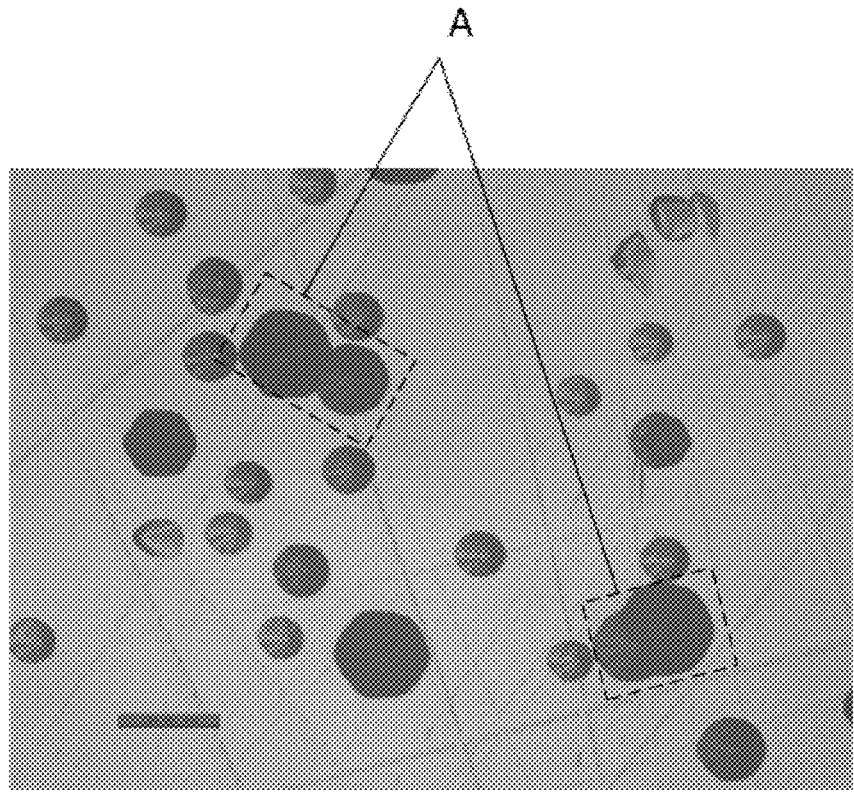
Figure 8:
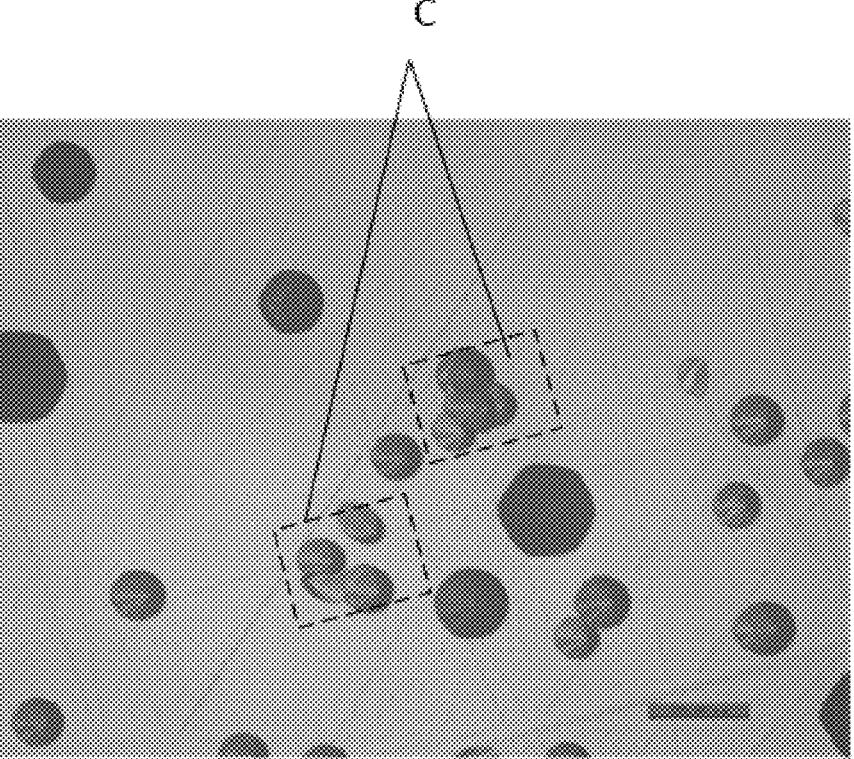
Figure 9:
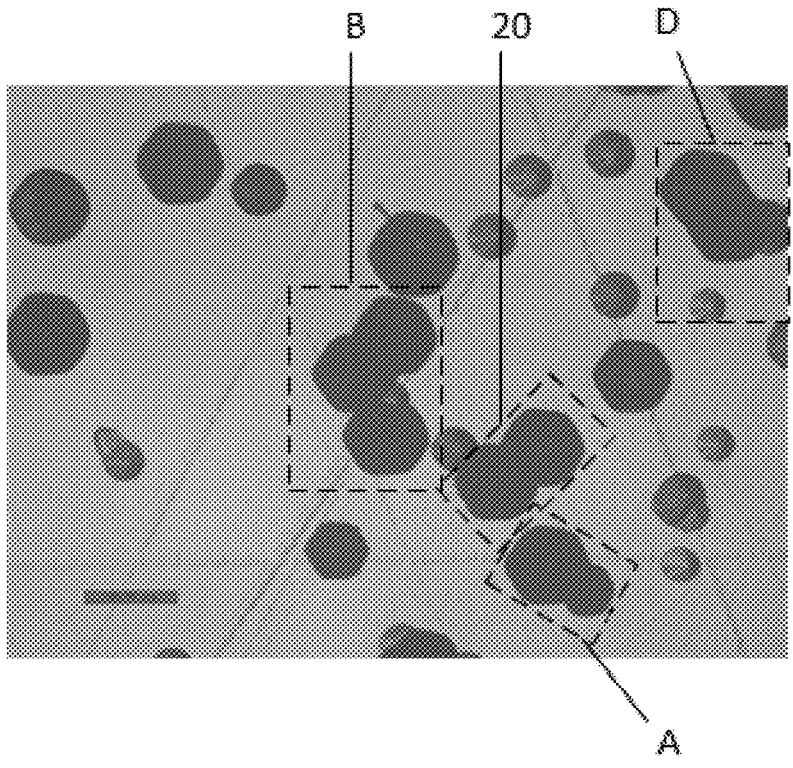
Figure 10:
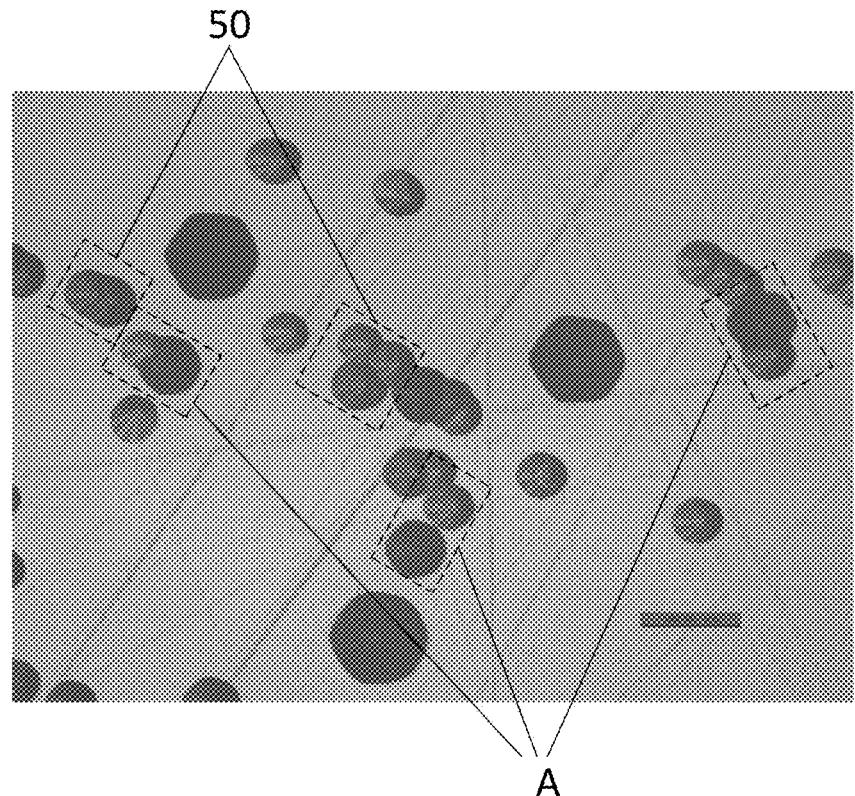
Figure 11:
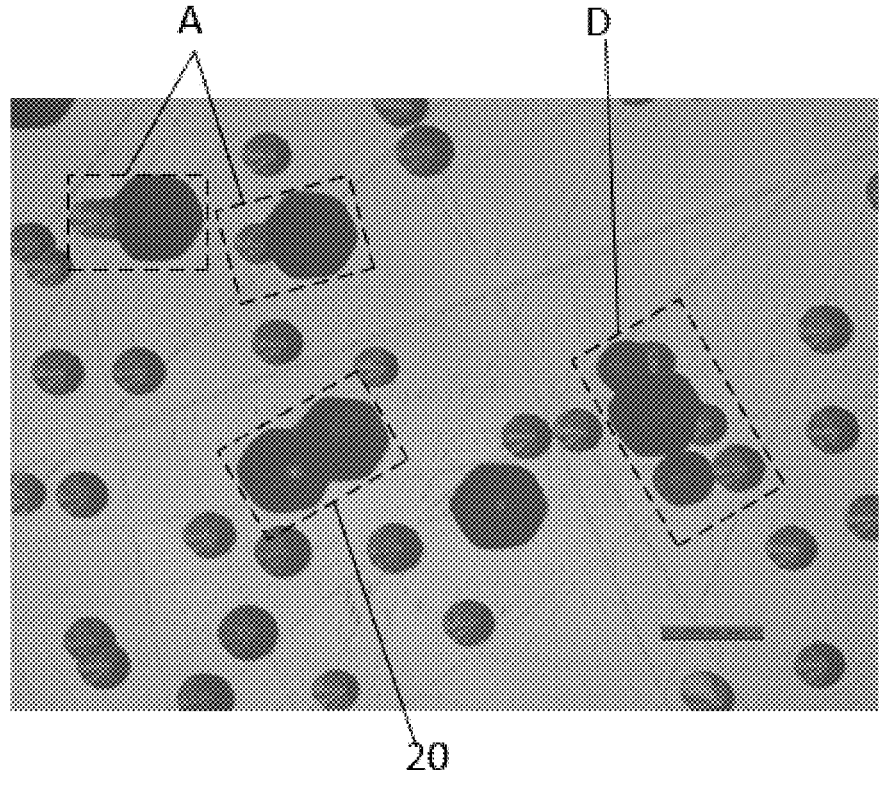

In another embodiment, the clustered dislocations may be clustered threading edge dislocations. Specifically, as shown in FIG. 5, the clustered threading edge dislocation 50 constitutes a dislocation cluster in which a distance between geometric centers of every two etching pits is less than 60 μm when the SiC monocrystalline wafer is etched by using molten potassium hydroxide, and the etching pits are exposed on the surface of the SiC monocrystalline wafer. As can be seen from FIG. 5, the threading edge dislocations correspond to a smaller diameter or a smaller dimension than the threading screw dislocations. Hence, in this embodiment, the clustered threading edge dislocations refer to a dislocation cluster in which a distance between geometric centers of any two etching pits is less than 60 μm.

The surface of the SiC monocrystalline wafer has a deviation angle ranging from 0° to 8° with respect to the direction of the c-axis, end points included. A density of clustered threading edge dislocations in the SiC monocrystalline wafer is less than 200/cm². The threading edge dislocations are more than the threading screw dislocations, and hence the density of clustered threading edge dislocations is limited to less than 200/cm² herein. Although such threshold is slightly higher than that of the clustered threading screw dislocations, lots of experiments have verified that the yield of SiC can still be improved.

In other embodiments, the clustered threading edge dislocations may refer to a dislocation cluster in which a distance between geometric centers of any two etching pits is less than 50 μm. More preferably, the clustered threading edge dislocation may refer to a dislocation cluster in which a distance between geometric centers of any two etching pits is less than 40 μm. The density of clustered threading edge dislocations may be limited to less than 100/cm². In other embodiments, such density may be more preferably less than 50/cm², more preferably less than 20/cm², more preferably less than 10/cm², more preferably less than 5/cm², or more preferably less than 1/cm². The lower the density of clustered threading edge dislocations is, the lower degree the dislocations aggregate at. Hence, the production yield of SiC-based wafers can be further improved even under dense dislocations.

Moreover, there may be clustered hybrid dislocations, which are formed by multiple types of dislocations, in the SiC monocrystalline wafer. In one embodiment, the clustered dislocations may be clustered hybrid dislocations. Specifically, as shown in FIGS. 6 to 11, the clustered hybrid dislocations (A) refer to a dislocation cluster in which a distance between geometric centers of an etching pit corresponding to any threading screw dislocation and an etching pit corresponding to any threading edge dislocation is less than 60 μm when the SiC monocrystalline wafer is etched by using molten potassium hydroxide, and the etching pits are exposed on the surface of the SiC monocrystalline wafer. In other embodiments, other types of hybrid dislocations may present, for example, a dislocation cluster in which a distance between geometric centers of an etching pit corresponding to any threading screw dislocation and an etching pit corresponding to any basal plane dislocation is less than certain microns, a dislocation cluster in which a distance between geometric centers of an etching pit corresponding to any basal plane dislocation and an etching pit corresponding to any threading edge dislocation is less than certain microns, or a dislocation cluster in which a distance between geometric centers of an etching pit corresponding to any threading screw dislocation and an etching pit corresponding to any threading edge dislocation is less than certain microns. That is, dislocations of any two of the aforementioned types when clustered together may be called the clustered hybrid dislocations, which is not limited herein. In these embodiments, as shown in FIGS. 6 to 11, a cluster comprising a threading screw dislocation and a basal plane dislocation is denoted as to as clustered hybrid dislocations (B), a cluster comprising a base plane dislocation and an threading edge dislocation is denoted as clustered hybrid dislocations (C), and a cluster comprising a threading screw dislocation, an threading edge dislocation and a basal plane dislocation is denoted as clustered hybrid dislocations (D).

The included angle between the normal direction of the surface of the SiC monocrystalline wafer and the direction of the c-axis ranges from 2° to 8°, end points included. A density of clustered hybrid dislocations in the SiC monocrystalline wafer is less than 50/cm². In other embodiments, clustered hybrid dislocations may refer to a dislocation cluster in which a distance between geometric centers of an etching pit corresponding to any threading screw dislocation and an etching pit corresponding to any threading edge dislocation is less than 50 μm, which corresponds to improved performances of the SiC monocrystalline wafer. More preferably, the clustered hybrid dislocation may refer to a dislocation cluster in which a distance between geometric centers of an etching pit corresponding to any threading screw dislocation and an etching pit corresponding to any threading edge dislocation is less than 40 μm. The density of the clustered hybrid dislocations may be limited to less than 50/cm². In other embodiments, such density may be more preferably less than 20/cm², more preferably less than 10/cm², more preferably less than 5/cm², or more preferably less than 2/cm². The lower the density of clustered hybrid dislocations is, the lower degree the dislocations aggregate at. Hence, the production yield of SiC-based wafers can be further improved under low dislocation density.

According to embodiments of the present disclosure, the included angle between the normal direction of the surface of the SiC monocrystalline wafer and the direction of the c-axis ranges from 0° to 8°, and the density of clustered dislocations in the SiC monocrystalline wafer is lower than 300/cm². The clustered dislocations constitute the dislocation cluster, in which the distance between geometric centers of every two etching pits is less than 80 μm when SiC monocrystalline wafer is etched by using molten potassium hydroxide. The density of the clustered dislocations may be low when the dislocations are sparse, thereby improving the yield of devices.

A semiconductor device is further provided according to an embodiment of the present disclosure on a basis of the forgoing SiC monocrystalline wafer (or monocrystalline substrate). The semiconductor device is manufactured by using the SiC monocrystalline wafer (or monocrystalline substrate) according to the foregoing embodiments. As the yield of SiC monocrystalline wafers is improved, a performance and a yield of corresponding semiconductor devices are also improved.

In addition, a method for manufacturing a SiC crystal is further provided according to an embodiment of the present disclosure. Reference is made to FIG. 12, which shows a flowchart of a method for manufacturing a SiC crystal according to an embodiment of the present disclosure. The method includes steps S101 to S105.

In step S101, a crucible filled with SiC charge is sealed with a graphite cover having no seed crystal, and then the crucible sealed with the graphite cover are preprocessed.

At an early stage of growing SiC, many defects such as carbon inclusion and polytypism may be formed on the seed/boule interface. Researches reveal that that clustered threading screw dislocations are apt to be generated at inclusion sites, and clustered basal plane dislocations and clustered threading edge dislocations are resulted from the polytypism defects.

Herein it is proposed that the crucible filled with charge is preprocessed as an integral at a temperature ranging from 2000° C. to 2200° C. and a pressure less than 10 Pa, while the crucible is constantly vacuumized. The preprocessing lasts for 1 hour to 10 hours. In one aspect, impurities volatile elements, which are at a surface of the charge and in the crucible, are disposed to prevent the impurities from being wrapped in the crystal and forming inclusions at the early stage of the seed/boule interface. In another aspect, the SiC charge is carbonized, silicon-rich elements are fast volatilized under the low pressure and pumped out via a vacuum pump, and hence a uniform graphene layer or a carbon layer is formed on a surface of the SiC charge. Thereby, wrapped silicon inclusions due to a high density of silicon-rich elements are prevented at the early stage when fresh SiC charge serve as a seed of the growth interface, and hence clustered dislocations, especially clustered threading screw dislocations, are avoided.

In step S102, a seed crystal, in which a density of clustered dislocations is less than 200/cm², is provided.

Dislocations would be inherited from the seed crystal. In most cases, threading screw dislocations and threading edge dislocations extend along the direction of the c-axis and move little when the seed crystal grows along a direction of small deviation. Basal plane dislocations move within the c-plane. Therefore, the dislocation cluster comprising pure threading screw dislocations, pure threading edge dislocations, or a combination of the two would be substantially be inherited, while the dislocation cluster concerning basal plane dislocations would be altered during the growth.

Therefore, a seed crystal with a low density of clustered dislocations is selected in this embodiment to suppress generation of dislocations. The density of clustered dislocations in the seed crystal is less than $200/cm^2$. Additionally, the density of clustered dislocations of the seed crystal is less than $100/cm^2$. Additionally, the density of clustered dislocations of the seed crystal is less than $50/cm^2$. Additionally, the density of clustered dislocations of the seed crystal is less than $10/cm^2$. Additionally, the density of clustered dislocations of the seed crystal is less than $5/cm^2$. Additionally, the density of clustered dislocations of the seed crystal is less than $1/cm^2$. Additionally, the density of clustered dislocations of the seed crystal is less than $0.5/cm^2$.

Moreover, optionally, a density of clustered threading screw dislocations in the seed crystal is less than $10/cm^2$, a density of clustered threading screw dislocations in the seed crystal is less than $5/cm^2$, a density of clustered threading screw dislocations in the seed crystal is less than $1/cm^2$, or a density of clustered threading screw dislocations in the seed crystal is less than $0.5/cm^2$.

In step S103, a graphite cover having the seed crystal is installed on the pre-processed crucible, where the pre-processed graphite cover is replaced with the graphite cover having the seed crystal.

After the pre-processing is completed, the pre-processed graphite cover having no seed crystal is replaced with the cover having the SiC seed crystal. Growth begins after the replacing cover is assembled to the crucible.

In step S104, the SiC crystal is grown.

During the growth, the pressure and temperature need to be stabilized. Fluctuations in the temperature is less than 2° C., and fluctuations in the pressure is less than 0.2 Pa. Thereby, it is prevented that fluctuations of a temperature field results in an instable growth interface, and thereby induces generation of clustered dislocations, especially clustered basal plane dislocations, since the basal plane dislocations are more susceptible to temperature fluctuations.

Specifically, the SiC crystal may be grown by using the graphite cover having the seed crystal in which a density of clustered dislocations is less than $200/cm^2$, under a growth temperature ranging between 2200° C. and 2300° C. and a growth pressure ranging between 50 Pa and 4000 Pa. Fluctuations in the temperature is less than 2° C., and fluctuations in the pressure is less than 0.2 Pa.

Optionally, the SiC crystal is grown under the growth temperature of 2300° C. and the growth temperature of 2000 Pa, the fluctuations in the temperature is less than 2° C., and the fluctuations in the pressure is less than 0.2 Pa.

In step S105, in-situ annealing is performed.

In an embodiment, a temperature is increased to be higher than the growth temperature by a difference ranging from 50° C. to 200° C., preferably ranging from 100° C. to 200° C. An annealing pressure is higher than 20000 Pa. The annealing is lasts for 10 hours to 100 hours, preferably 20 hours to 30 hours. Then, the temperature is gradually reduced for cooling.

Researches reveal that an annealing temperature of a crystal should be higher than the growth temperature of a crystal in order to reduce clustered dislocations, especially clustered threading edge dislocations, and prompt migration of dislocations effectively. The clustered dislocations are very likely to merge and disappear after migration, since a distance between the clustered dislocations is very small. Alternatively, the clustered dislocations may move to a boundary of the crystal after migration. Thereby, the dislocation cluster is suppressed. In a case that the annealing is performed at a temperature close to the growth temperature of the crystal, it is difficult to suppress the dislocation clusters effectively, since the dislocations have been stabilized at such temperature. Moreover, the temperature cannot be too high, otherwise SiC may sublimate or decompose even under a high pressure.

In this embodiment, the annealing is optionally performed for 10 hours to 100 hours at a temperature higher than the growth temperature by a difference ranging from 50° C. to 200° C. and at a pressure higher than 20000 Pa.

A SiC crystal is further provided according to an embodiment of the present disclosure based on the same concept. The SiC crystal which is manufactured through the foregoing method. After the SiC crystal is formed through the method, the SiC crystal is cut, ground, and then polished to form a SiC monocrystalline wafer. The SiC monocrystalline wafer has a low degree of dislocation aggregation.

An inventive method implementing a low degree of dislocation aggregation is provided according to embodiments of the present disclosure. The method addresses an issue of dislocation clustering effectively by pre-processing the charge, increasing the annealing temperature, and the like. Product quality is improved, and a SiC monocrystalline substrate product having less clustered dislocations are invented.

Hereinafter shown is a comparative experiment, which illustrates the effect of the SiC monocrystalline wafer having less clustered dislocations according to embodiments of the present disclosure.

Figure 13:
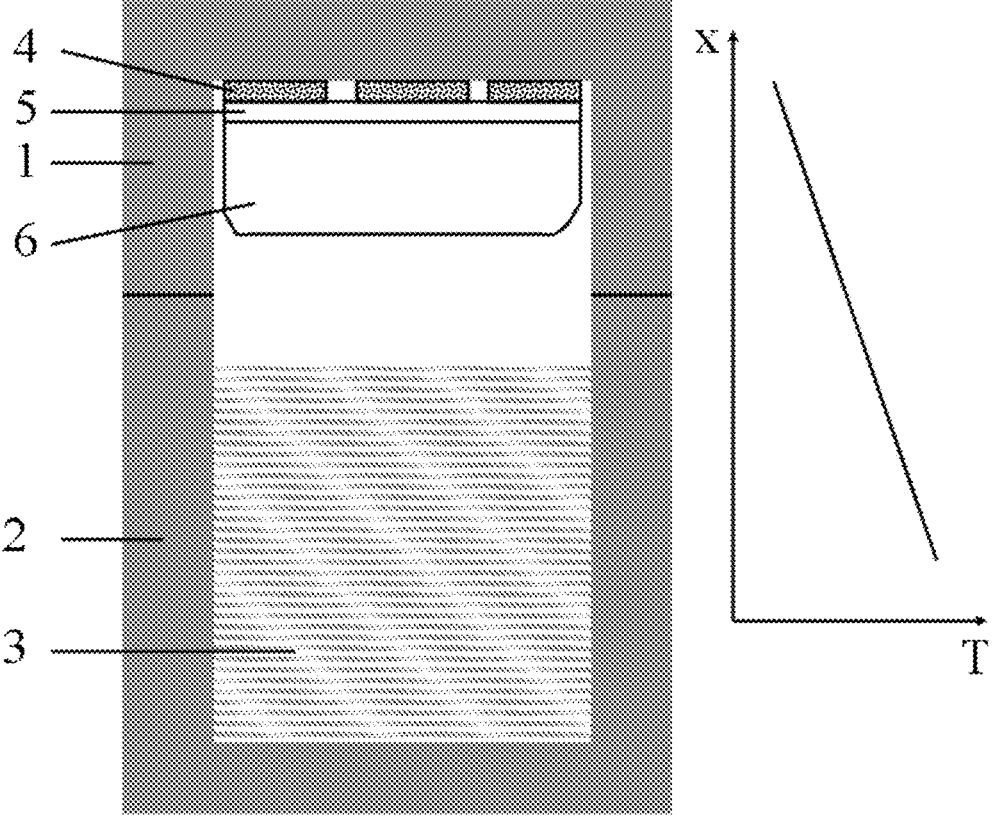
FIG. 13 is a schematic structural diagram of a chamber for growing a silicon carbide crystal through physical vapor transport.

In an embodiment, the SiC crystal is grown through physical vapor transport. Reference is made to FIG. 13, which is a schematic structural diagram of a chamber for growing the SiC crystal through physical vapor transport. The growth chamber comprises: a graphite cover 1, a graphite crucible 2, SiC charge 3, an adhesive 4, a seed crystal 5, and a growing crystal 6.

Embodiment 1

The crucible filled with SiC charge is sealed with a graphite cover having no seed crystal, located in a SiC monocrystalline furnace, and preprocessed at a temperature of 2200° C. and a pressure less than 0.1 Pa. At the same time, a vacuum pump keeps operating. The above processing lasts for 5 hours, then the furnace is cooled down. The crucible filled with the SiC charge is weighed and it shows a weight decreases by 3%, which indicates that impurities and silicon-rich components on the surface of the charge and of the crucible have been effectively removed.

A seed crystal which is a 4° 6-inch SiC seed crystal having low density of clustered dislocations is fixed on the cover. The graphite cover having no seed crystal is replaced by the cover having the seed crystal. After the replacement, the crucible is disposed into the furnace again to grow at a temperature of 2300° C., with temperature fluctuations less than 1° C., and a pressure of 2000 Pa, with pressure fluctuations less than 0.1 Pa. After the growth, annealing is performed for 150 hours at a temperature that is 180° C. higher than the growth temperature and at a pressure of 60000 Pa. Then the temperature is gradually reduced for cooling. The obtained crystal is cut into 350 μm-thick, 6-inch SiC wafers. Potassium hydroxide etching is performed to count clustered dislocations of different types, and the densities of these clustered dislocations are calculated accordingly. The result shows that the density of clustered dislocations is $157/cm^2$, the density of clustered threading screw dislocations is $1.3/cm^2$, the density of clustered basal plane dislocations is $3.5/cm^2$, the density of clustered threading edge dislocations is $48/cm^2$, and the density of clustered hybrid dislocations (A) is $3.2/cm^2$.

Control Experiment 1

The growth is performed through a conventional method. A crucible filled with SiC charge is directly sealed with a cover having a 4° 6-inch seed crystal, and then disposed into a furnace for growth. The growth temperature is 2300° C. with maximum fluctuations being 12° C. throughout the whole growing process, and the growth pressure is 2000 Pa with maximum fluctuations being 8 Pa throughout the whole growing process. After the growth, annealing is performed for 5 hours at the same temperature of 2300° C. and at a pressure of 60000 Pa. Then the temperature is gradually reduced for cooling. Finally, the 6-inch crystal is obtained and cut into 350 μm-thick, 6-inch SiC wafers. Potassium hydroxide etching is performed to count clustered dislocations of different types, and the densities of these clustered dislocations are calculated accordingly. The result shows that the density of clustered dislocations is $832/cm^2$, the density of clustered threading screw dislocations is $23/cm^2$, the density of clustered basal plane dislocations is $68/cm^2$, the density of clustered threading edge dislocations is $366/cm^2$, and the density of clustered hybrid dislocations (A) is $82/cm^2$.

Ten 6-inch wafers based on the embodiment 1 and ten 6-inch wafers based on the control experiment 1 are subject to epitaxy and device fabrication as one batch. A result shows that an average yield of devices corresponding to the embodiment 1 is 19% higher than that corresponding to the control experiment 1.

The foregoing results indicate that embodiments of the present disclosure can significantly improve quality of SiC monocrystalline product, and has a great technical advantage over conventional technology. Application to devices shows that the yield of the devices is also greatly improved. The improved yield further has a significant economic value.

The embodiments of the present disclosure are described in a progressive manner, and each embodiment places emphasis on the difference from other embodiments. Therefore, one embodiment can refer to other embodiments for the same or similar parts.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but confirms to a widest scope in accordance with principles and novel features disclosed in the present disclosure.

The invention claimed is:

1. A silicon carbide monocrystalline wafer, wherein:
an included angle between a normal direction of a surface of the silicon carbide monocrystalline wafer and a direction of a c-axis ranges from 0° to 8°;
a density of dislocations on the surface of the silicon carbide monocrystalline wafer is higher than $1000/cm^2$; and
wherein a density of clustered dislocations is equal to a quantity of clustered dislocations divided by an area of the silicon carbide monocrystalline wafer, and the quantity of clustered dislocations is defined as a half of a total quantity of first dislocations among the dislocations on the surface of the silicon carbide monocrystalline wafer; and
wherein the first dislocations comprise any dislocation, among target dislocations on the surface, which satisfies: there is at least one etching pit located within 80 μm from an etching pit of said dislocation when the surface of the silicon carbide monocrystalline wafer is etched using molten potassium hydroxide, the at least one etching pit is of any dislocation other than said first dislocation among the target dislocations, and the etching pit of said first dislocation and the at least one etching pit are exposed on the surface of the silicon carbide monocrystalline wafer due to etching of the molten potassium hydroxide;
wherein when the target dislocations comprise all threading screw dislocation, all threading edge dislocation, and all basal plane dislocation on the surface, the density of clustered dislocations on the surface of the silicon carbide monocrystalline wafer is lower than $300/cm^2$.

2. The silicon carbide monocrystalline wafer according to claim 1, wherein:
when the target dislocations are all threading screw dislocations on the surface, the density of clustered dislocations on the surface of the silicon carbide monocrystalline wafer is less than $20/cm^2$.

3. The silicon carbide monocrystalline wafer according to claim 2, wherein:
the first dislocations comprises any dislocation, among the target dislocations on the surface, which satisfies: there is the at least one etching pit located within 60 μm from the etching pit of said first dislocation when the surface of the silicon carbide monocrystalline wafer is etched using the molten potassium hydroxide; and
when the target dislocations are all threading screw dislocations on the surface, the density of clustered dislocations on the surface of the silicon carbide monocrystalline wafer is less than $5/cm^2$.

4. The silicon carbide monocrystalline wafer according to claim 1, wherein:
the included angle ranges from 2° to 8°;
the first dislocations comprises any dislocation, among the target dislocations on the surface, which satisfies: there is the at least one etching pit located within 40 μm from the etching pit of said dislocation when the surface of the silicon carbide monocrystalline wafer is etched using the molten potassium hydroxide; and when the target dislocations are all basal plane dislocations on the surface, the density of clustered dislocations on the surface of the silicon carbide monocrystalline wafer is less than 50/cm$^2$.

5. The silicon carbide monocrystalline wafer according to claim 1, wherein:

the first dislocations comprises any dislocation, among the target dislocations on the surface, which satisfies: there is the at least one etching pit located within 40 μm from the etching pit of said first dislocation when the surface of the silicon carbide monocrystalline wafer is etched using the molten potassium hydroxide; and when the target dislocations are all threading edge dislocations on the surface, the density of clustered dislocations on the surface of the silicon carbide monocrystalline wafer is less than 200/cm$^2$.

6. The silicon carbide monocrystalline wafer according to claim 1, wherein:

the first dislocations comprises any dislocation, among the target dislocations on the surface, which satisfies: there is the at least one etching pit located within 60 μm from the etching pit of said dislocation when the surface of the silicon carbide monocrystalline wafer is etched using the molten potassium hydroxide; and when the target dislocations are all threading edge dislocations and all threading screw dislocations, on the surface, the density of clustered dislocations on the surface of the silicon carbide monocrystalline wafer is less than 50/cm$^2$.

7. A method for manufacturing the silicon carbide crystal wafer according to claim 1, comprising:

sealing a crucible with a graphite cover having no seed crystal, wherein the crucible is filled with silicon carbide charge;

preprocessing the crucible sealed with the graphite cover;

providing a seed crystal, wherein a density of clustered dislocations in the seed crystal is less than 200/cm$^2$;

installing a graphite cover having the seed crystal on the pre-processed crucible, wherein the pre-processed graphite cover is replaced with the graphite cover having the seed crystal; and growing a silicon carbide crystal by using the pre-processed crucible and the installed graphite cover; and performing in-situ annealing after growing the silicon carbide crystal.

8. The method according to claim 7, wherein the preprocessing comprises:

setting a temperature in the crucible in a range from 2000° C. to 2200° C. and a pressure in the crucible less than 10 Pa; and exhausting the crucible continuously with a vacuum pump; and wherein the pre-processing lasts for 1 hour to 10 hours.

9. The method according to claim 7, wherein growing the silicon carbide crystal comprises:

growing the silicon carbide crystal by using the graphite cover having the seed crystal in which the density of clustered dislocations is less than 200/cm$^2$, under a growth temperature ranging from 2200° C. and 2300° C. and a growth pressure ranging from 50 Pa to 4000 Pa, wherein fluctuations of the growth temperature are less than 2° C. and fluctuations of the growth pressure are less than 0.2 Pa.

10. The method according to claim 7, wherein the in-situ annealing comprises:

annealing, for a period ranging from 10 hours to 100 hours, at a temperature which is higher than the growth temperature by a difference ranging from 50° C. to 200° C. and at a pressure which is higher than 2000 Pa.

11. The method according to claim 7, further comprising:

cutting, grinding, and polishing the silicon carbide crystal to obtain the silicon carbide monocrystalline wafer.

12. A semiconductor device, manufactured by using a silicon carbide monocrystalline wafer according to claim 1, wherein:

an included angle between a normal direction of a surface of the silicon carbide monocrystalline wafer and a direction of a c-axis ranges from 0° to 8°;

a density of dislocations on the surface of the silicon carbide monocrystalline wafer is higher than 1000/cm$^2$;

a density of clustered dislocations on the surface of the silicon carbide monocrystalline wafer is lower than 300/cm$^2$; and wherein a density of clustered dislocations is equal to a quantity of dislocations divided by an area of the silicon carbide monocrystalline wafer, and the quantity of clustered dislocations is defined as a half of a total quantity of first dislocations among the dislocations on the surface of the silicon carbide monocrystalline wafer; and wherein the first dislocations comprises any dislocation, among target dislocations on the surface, which satisfies: there is at least one etching pit located within 80 μm from an etching pit of said dislocation when the surface of the silicon carbide monocrystalline wafer is etched using molten potassium hydroxide, the at least one etching pit is of any dislocation other than said dislocation among the target dislocations, and the etching pit of said dislocation and the at least one etching pit are exposed on the surface of the silicon carbide monocrystalline wafer due to etching of the molten potassium hydroxide; wherein when the target dislocations comprise all threading screw dislocation, all threading edge dislocation, and all basal plane dislocation on the surface, the density of clustered dislocations on the surface of the silicon carbide monocrystalline wafer is lower than 300/cm$^2$.

13. The silicon carbide monocrystalline wafer according to claim 1, wherein the density of dislocations on the surface of the silicon carbide monocrystalline wafer is higher than 2000/cm$^2$.

14. The silicon carbide monocrystalline wafer according to claim 1, wherein the density of dislocations on the surface of the silicon carbide monocrystalline wafer is higher than 4000/cm$^2$.

15. The silicon carbide monocrystalline wafer according to claim 1, wherein the density of dislocations on the surface of the silicon carbide monocrystalline wafer is smaller than 10000/cm$^2$.

* * * * *